United States Patent [19]
Xu et al.

[11] Patent Number: 5,701,075
[45] Date of Patent: *Dec. 23, 1997

[54] MAGNETIC RESONANCE IMAGING SHIMMING BY SUPERCONDUCTING GRADIENT SHIELD

[75] Inventors: Bu-Xin Xu, Florence, S.C.; Yannis P. Tsavalas, Clifton Park, N.Y.

[73] Assignee: General Electric Company, Milwaukee, Wis.

[*] Notice: The term of this patent shall not extend beyond the expiration date of Pat. No. 5,539,367.

[21] Appl. No.: 583,186

[22] Filed: Jan. 4, 1996

[51] Int. Cl.$^6$ .............................. G01R 33/38; H01F 7/02
[52] U.S. Cl. .............................. 324/318; 335/301
[58] Field of Search .............................. 324/318, 319, 324/320, 322; 335/296, 297, 298, 299, 300, 301, 302

[56] References Cited

U.S. PATENT DOCUMENTS

| | | | |
|---|---|---|---|
| 4,876,510 | 10/1989 | Siebold et al. | 324/319 |
| 4,878,024 | 10/1989 | Overweg et al. | 324/319 |
| 4,899,109 | 2/1990 | Tropp et al. | 324/319 |
| 5,132,618 | 7/1992 | Sugimoto | 324/318 |
| 5,280,247 | 1/1994 | DeMeester et al. | 324/318 |
| 5,289,128 | 2/1994 | DeMeester et al. | 324/318 |
| 5,349,297 | 9/1994 | DeMeester et al. | 324/318 |
| 5,539,367 | 7/1996 | Xu et al. | 324/318 |

*Primary Examiner*—Sandra L. O'Shea
*Assistant Examiner*—Roger C. Phillips
*Attorney, Agent, or Firm*—Irving M. Freedman; John H. Pilarski

[57] ABSTRACT

A magnetic resonance imaging superconducting magnet including a cryostat, a gradient coil and superconducting gradient shield positioned around the gradient coil with an active resistive shimming member contiguous to the cryostat vessel; and the gradient shield being selectively cooled to superconducting operation after the magnetic shimming fields generated by the shimming member for field homogeneity within the bore of the magnetic resonance imaging magnet are induced onto, and maintained by, the superconducting gradient shield and operation of the resistive shimming member discontinued.

10 Claims, 1 Drawing Sheet

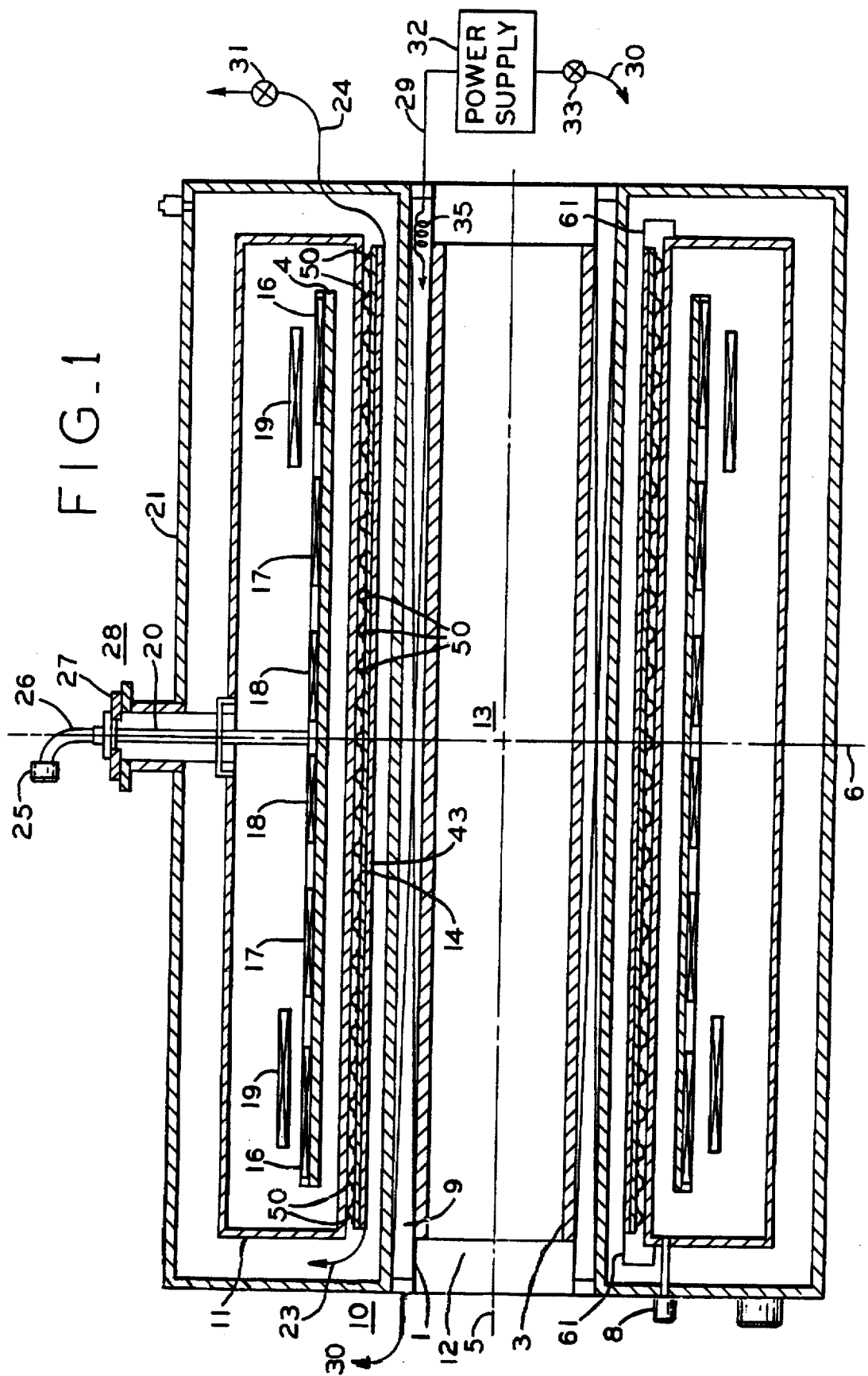

5,701,075

1

MAGNETIC RESONANCE IMAGING SHIMMING BY SUPERCONDUCTING GRADIENT SHIELD

BACKGROUND OF INVENTION

Modern magnetic resonance imaging (hereinafter "MRI") requires a highly uniform magnetic field in a imaging region, generally only a few ppm field inhomogeneity over 40 to 50 DSV volume is acceptable. Various sophisticated coil and shield design techniques have been developed to achieve such high field homogeneity. However, due to the manufacturing tolerance, the actually obtained field inhomogeneity is usually much larger than that expected even for a perfectly designed magnet. In practice, a process called field shimming therefore becomes necessary to compensate main magnet field inhomogeneities after the magnet is ramped up to superconducting operation.

Mathematically, the field inhomogeneity can be expressed as the existence of various orders of harmonic field. The idea of shimming is to create another harmonic field and cancel the harmonic field from main magnet. Currently there are three techniques used for shimming. The active superconducting shimming technique is to use a set of specially designed superconducting coils inside the magnet cryostat that are able to produce specific harmonic fields with the strength of harmonic field adjusted by adjusting the magnitude of the current in coils. This technique requires not only superconducting coils but also superconducting switches to keep current persistent. The active resistive shimming technique is to use a set of specially designed copper wire coils usually located in the magnet warm bore that are able to produce specific harmonic fields. The strength of harmonic field can be adjusted by the current in coils. This technique requires not only a set of copper coils but also a set of precision power supplies to keep the current in the coils stable. The passive shimming technique is to use a set of iron pieces inside the magnet warm bore to produce a harmonic field due to the iron magnetization in the main magnetic field with the field harmonics and their strength adjusted by the locations and masses of iron pieces placed inside the magnet warm bore. While this technique does not require cots and power supplies, the adjustment of the locations and masses of iron pieces is not an easy task due to the interaction forces between iron pieces and main magnet fields.

In addition to a highly uniform magnetic field, the magnetic resonance imaging technology requires an accurately linear magnetic field gradient extending over the imaging volume which can be switched on and off in times of much less than 1 millisecond. The gradient magnetic field is therefore a time varying field. This time varying magnetic field will induce eddy currents in various metallic structures of the main magnet and its associated cryostat and in the main magnet coils. The presence of eddy currents are most undesirable in MRI imaging since the target or imaging field becomes a superposition of the driven and eddy current fields. The eddy current fields have both a temporal and spatial dependence. Moreover, the eddy current fields of high order spatial dependence with finite time constants can not be readily compensated for, and will result in impaired imaging quality. In addition, the presence of eddy currents in the main magnet structures and coils will generate heat due to the finite electrical resistance of the structural materials and the superconducting wire stabilizer. This is the so called AC heating effect of eddy currents which presents problems of inadequate cooling, and can results in excessive helium boil off in helium cooled superconducting magnets.

2

It is therefore necessary to provide a gradient shield between the gradient coil and the main magnet coils. An advanced superconducting gradient system is described in the copending U.S. patent application, Ser. No. 08/236,060, filed May 2, 1994 entitled "Superconducting Gradient Coil Shields In Magnetic Resonance Imaging Magnets" now U.S. Pat. No. 5,539,367 and assigned to the same assignee as the present invention, which is hereby incorporated by reference. That patent application describes the use of a superconducting cylinder made of NbTi or $Nb_3Sn$ sheets to shield the imaging magnetic field from the magnetic effects of the gradient coil pulses.

The present invention is directed at the use of such a superconducting shield as a main magnet shimming element to replace the conventional MRI shimming arrangements.

OBJECTS AND SUMMARY OF INVENTION

It is the object of the present invention to provide improved shimming means for main magnet shimming of MRI equipment.

It is a further object of the present invention to provide improved main magnet shimming for MRI equipment which utilizes a superconducting gradient shield.

It is another object of the present invention to provide improved main magnet shimming means for MRI which only temporarily requires the use of an active resistive shimming draw.

In accordance with form of the invention, a superconducting MRI magnet assembly includes a vessel cooled to superconducting temperatures surrounding a central imaging bore, a main magnet coil in the vessel and surrounding the imaging bore to provide a magnetic field in the imaging bore, and a superconducting gradient shield contiguous to the vessel selectively cooled to superconducting temperatures and interposed between the main magnet coil and the imaging bore. An active resistive shimming member along with its power supply is positioned within the imaging bore for selectively generating harmonic currents and magnetic fields to reduce field inhomogeneities within the imaging region of the imaging bore. The harmonic currents on the active resistive shimming member are transferred to the superconducting gradient shield by cooling the shield to superconducting temperatures after which the generation of the harmonic currents within the resistive shimming member may be discontinued, and the resistive shimming member along with its power supply removed from the magnet assembly, eliminating the need for maintaining powered precision power supplies to keep the currents in the coils of the active resistive shimming member stable.

BRIEF DESCRIPTION OF DRAWINGS AND DETAILED DESCRIPTION OF PREFERRED EMBODIMENT OF INVENTION

FIG. 1 is a cross section of superconducting MRI magnet including the present invention.

Referring to FIG. 1, superconducting MRI magnet assembly 10 includes pressure vessel 11 concentrically within donut shaped vacuum vessel 21 forming a central imaging bore 12 about axis 5. Positioned within pressure vessel 11 is composite drum 4 with three pairs of main magnet coils 16, 17 and 18 of decreasing axial length toward plane 6 perpendicular to axis 5. Main magnet coils 16, 17 and 18 are axially spaced on composite dram 4 and wound in axial slots on the drum. Additional coils such as bucking coils 19 are provided to contribute to reducing the external magnetic field.

External electrical power and control connections are provided through access port 28 by lead assembly 26 which includes connector 25 outside vacuum vessel 21 and conduit 20 passing through plate 27 for electrical connection to the components including magnet coils 16, 17, 18 and 19 within pressure vessel 11. In the case of liquid helium cooled MRI magnet assembly 10, liquid helium is provided through inlet pipe 8 to pressure vessel 11. In the case of cryogenless cooling, mechanical conduction cooling is provided by a thermally linked mechanical cryocooler 8 in place of the liquid helium.

Superconducting gradient shield 14 is a cylindrical member, described in more detail in our aforementioned copending patent application, and is positioned within the bore and in thermal contact with pressure vessel 11 intermediate main magnet coils 16, 17 and 18 and central imaging bore 12. Positioned within sleeve 1 against the central bore of vacuum vessel 21 surrounding central imaging bore 12 is gradient coil 3 to pulse or fire a series of imaging "snapshot slices" along axis 5 of a patient within imaging bore 12. Superconducting gradient shield 14 is fabricated from a sheet of superconducting niobium alloy material such as NbTi or $Nb_3Sn$ bent around a mandrel with ends 40 and 41 connected such as by soldering to form a cylinder 14. Either of these materials can be made superconducting with liquid helium cooling. However, $Nb_3Sn$ can be utilized with cryogenless conduction cooling such that it is suitable and desirable for use in MRI equipment which does not require liquid helium cooling. That is, while NbTi can be operated at a superconducting temperature of around 4° K., $Nb_3Sn$ can be made superconducting at higher temperatures, up to a temperature of around 15° K., which can be provided by mechanical refrigerator 8, eliminating the need for liquid helium. Superconducting gradient shield 14 can eliminate magnetic field from penetration of time varying magnetic fields produced by firing the gradient coil and effectively magnetically shields the main magnet structures from the gradient coil, providing a gradient coil shield which has minimum AC heating (typically less than a few milliwatts) and very long (more than a thousand seconds) and even substantially infinite time constants. Shield 14 is suitable for general use, including use in cryogenless conduction cooled MRI magnets such as cooling by mechanical refrigerator 8.

Shimming draw 9 within bore 12 of vacuum vessel 21 contains 18 orders of copper shimming coils comprising an active resistive shimming drawer inside the bore. The diameter of resistive shimming drawer 9 should be kept as close to that of superconducting shield 14 as possible, and therefore should be as large as the bore 12 size allows. In operation, main magnet coils 16, 17, 18 and bucking coil 19 are ramped up to superconducting operation and the superconducting gradient shield 14 is kept in the normal state by electrical heating through leads 23 and 24 to maintain its temperature above the superconducting state, after which active resistive shimming drawer 9 is used to shim the magnetic field within bore 12 to provide the necessary homogenous magnetic field in the imaging region shown generally as 13.

Active resistive shimming drawer 9 is connected to a power supply indicated generally as 32 through connectors 29 and 30 such that the specially copper wire coils of the shimming drawer are able to produce specific desired harmonic field to shim main magnet field within bore 12 in a manner well known in the art. The strength of the harmonic fields is adjusted by current in the coils provided by variable precision power supply 32.

After the desired homogenous field distribution and magnetic homogeneity is obtained in the imaging region 13 of bore 12, superconducting shield 14 which was selectively heated electrically through leads 23 and 24 to maintain its temperature above superconducting operation is allowed to cool down to become superconducting upon opening of switch 25 in circuit with lead 24. Once superconducting shield 14 becomes superconducting, the current through the resistive shimming coils of shimming drawer 9 can be ramped down and discontinued by opening switch 33 in circuit with the coils, one of which 35 is shown schematically in circuit with connector 29. A similar current pattern to that generated by active resistive shimming drawer 9 is now induced on the superconducting shield which because of its superconducting operation will remain, even after the currents through the resistive shimming coils of shimming drawer 9 are completely discontinued. The induced current pattern on superconducting shield 14 which has been transferred from the resistive shimming coils of shimming drawer 9 will maintain the desired magnetic flux pattern, which in mm will maintain the homogeneity of the magnetic field within imaging region 13 of bore 12. This process of inducting or transferring current from the resistive shimming coils to superconducting shield 14 can be called or termed flux trapping.

Active resistive shimming drawer 9 can now be removed since there are no currents left in the shimming coils. Power supply 32 can be removed for use in shimming other imaging magnets, and if desired active resistive shimming drawer 9 can also be removed to be used again when needed on imaging magnet assembly 10, or on other imaging magnet assemblies. Since there is no need to continue to provide current flow to the resistive shimming coils in resistive shimming drawer 9, there is no need for a permanently activated precision external power supply 32.

In effect, active resistive shimming drawer 9 is used only temporarily to induce current flow patterns on superconducting gradient shield 14 after which its powering is discontinued and its power supply, and even the shimming drawer itself may be removed for subsequent use on the same or different imaging magnet assemblies.

Because of the radial separation of the resistive drawer 9 and superconducting gradient shield 14, the induced coupling may not be entirely perfect. If the induced field and magnetic field distribution is not perfectly transferred, the problem can be overcome in practice by proper undercharging or overcharging of shimming coils 35 based on a detailed calibration of imaging magnet assembly 10 in order to compensate for such minor field alterations due to current transfer.

Since superconducting gradient shield 14 is a continuous superconducting sheet, it can contain an infinite number of superconducting loops to enable continuous generation of the magnetic fields induced to shim and shield the main magnetic field in the imaging region 13 of bore 12 to the desired and necessary field homogeneity.

Superconducting gradient shield 14 could be placed within pressure vessel 11. However, the quenching of superconducting operation of superconducting gradient shield 14 would result in the application of heat through operation of heater 43 within pressure vessel 11 increasing helium boil-off in the case of cryogen cooling, or increasing and taxing the cooling requirements in the case of cryogen conduction cooling, neither of which is desirable. It is particularly desirable to avoid placing further demands on a cryogenless conduction cooling system which is frequently operating near its full capabilities. Compressed layers of aluminized mylar could be used in place of fingers 50. In a cryogenless conduction cooled superconducting magnet assembly, superconducting gradient shield 14 may be thermally connected to a thermal shield such as the 10° K. or a higher temperature thermal shield 61 as shown in FIG. 1.

While the present invention has been described with respect to certain preferred embodiments thereof, it is to be understood that numerous variations and details of construction, the arrangement and combination of parts, and the type of materials used may be made without departing from the spirit and scope of the invention.

What we claim is:

1. A superconducting magnetic resonance imager magnet assembly comprising;

a vessel cooled to superconducting temperatures surrounding a central imaging bore;

at least one superconducting main magnet coil in said vessel and surrounding said imaging bore to provide a magnetic field in said imaging bore;

an active resistive shimming member positioned contiguous to said imaging bore for selectively generating harmonic currents and magnetic fields for reducing inhomogeneities in the magnetic field within an imaging region in said imaging bore;

a superconducting gradient shield contiguous to said vessel selectively coded to superconducting temperatures, and interposed between said main magnet coil and said imaging bore;

said superconducting gradient shield being selectively cooled to a superconducting temperature after said resistive shimming member has generated said harmonic currents to enable transfer of said harmonic currents to said superconducting gradient shield; and means to selectively discontinue the generation of said harmonic currents in said resistive shimming member after said transfer.

2. The superconducting magnet assembly of claim 1 wherein said resistive shimming member is positioned within said central bore outside said vessel.

3. The superconducting magnet assembly of claim 2 wherein said resistive shimming member is selectively removable from said bore after said harmonic currents are transferred to said superconducting gradient shield.

4. The superconducting magnet assembly of claim 3 wherein said resistive shimming member is transportable and suitable for use as a shimming tool for a plurality of shimming operations on a plurality of superconducting magnets.

5. The superconducting magnet assembly of claim 4 including means to control the level of charging of said active resistive member.

6. The superconducting magnet assembly of claim 5 further including calibration means to enable said control of said level of charging to compensate for differences in the induced superconducting gradient shield currents and currents in said resistive shimming member.

7. The superconducting magnet assembly of claim 6 including variable precision power supplies external to said magnet assembly to generate said harmonic currents in said resistive shimming member.

8. The superconducting magnet assembly of claim 7 further including means to selectively discontinue the powering of said resistive shimming member.

9. A superconducting magnetic resonance imager magnet assembly comprising:

a vessel cooled to superconducting temperatures surrounding a central imaging bore;

at least one superconducting main magnet coil in said vessel and surrounding said imaging bore to provide a magnetic field in said imaging bore;

a gradient coil positioned contiguous to said imaging bore for generating pulsed imaging magnetic fields;

a superconducting gradient shield contiguous to said vessel which is selectively coolable to superconducting temperatures and is interposed between said main magnet coil and said gradient coil;

said gradient shield being positioned outside said vessel to enable the selective control of its superconducting operation without disrupting superconducting operation of said at least one main magnet coil;

a thermal connection between said gradient shield and said vessel;

said superconducting gradient shield shielding said superconducting main magnet coil from effects of the time varying magnetic field generated by said gradient coil; and means including heating means positioned outside said vessel to selectively heat said gradient shield to selectively discontinue superconducting operation of said gradient shield;

said heating means being operable independent of continuing superconducting operation of said at least one main magnet coil inside said vessel to selectively erase and subsequently enable induced current flow in said gradient shield by subsequently establishing said superconducting operation of said gradient shield.

10. The superconducting magnet assembly of claim 9 wherein said means to selectively heat includes a switch and external source of electrical power, wherein said switch enables said selective discontinuance and re-establishment of superconducting operation of said gradient shield independent of the continuing superconducting operation of said main magnet coil; and said switch selectively connects said electrical power to said heater.

* * * * *